United States Patent [19]

Simpson, Jr.

[11] 4,187,191

[45] Feb. 5, 1980

[54] PHOTORESIST STRIPPER WITH DODECYLSULFONIC ACID AND CHLORINATED SOLVENTS

[75] Inventor: George W. Simpson, Jr., Cicero, Ind.

[73] Assignee: General Motors Corporation, Detroit, Mich.

[21] Appl. No.: 928,094

[22] Filed: Jul. 26, 1978

[51] Int. Cl.² .......................... C23G 5/02; B08B 3/08
[52] U.S. Cl. ......................... 252/143; 134/3; 134/38; 134/42; 252/171; 252/554
[58] Field of Search ............ 252/162, 143, 171, 142, 252/558, 549, 554; 134/3, 38, 40, 42

[56] References Cited

U.S. PATENT DOCUMENTS

| | | |
|---|---|---|
| 3,075,923 | 1/1963 | Berst et al. ................. 252/143 X |
| 3,582,401 | 6/1971 | Berilla et al. ................ 252/143 X |
| 3,871,929 | 3/1975 | Schevey et al. .............. 134/3 X |
| 3,988,256 | 10/1976 | Vandermey et al. .......... 252/171 |
| 4,070,203 | 1/1978 | Neisius et al. ................ 252/143 X |
| 4,087,370 | 5/1978 | Singalewitch et al. ........ 252/143 |

FOREIGN PATENT DOCUMENTS 2632949  2/1977  Fed. Rep. of Germany ........... 252/143

*Primary Examiner*—Harris A. Pitlick
*Attorney, Agent, or Firm*—Robert J. Wallace

[57] ABSTRACT

A stripper for removing a photoresist mask. The stripper consists essentially, by volume, of about 50–85% tetrachloroethylene and ortho-dichlorobenzene in generally equal amounts, about 15–50% dodecylsulfonic acid, and up to 3% formic acid.

5 Claims, No Drawings

PHOTORESIST STRIPPER WITH DODECYLSULFONIC ACID AND CHLORINATED SOLVENTS

BACKGROUND OF THE INVENTION

This invention relates to a photoresist stripper and more particularly to a composition for removing an organic solvent strippable polymer and/or colloid photoresist mask from a face of a silicon wafer.

Various types of polymer and/or colloid materials are ued to partially mask surfaces for selective etching of those surfaces. The polymers may be natural or synthetic and are resistant to attack by acids. Such masking materials are frequently referred to as resists. Some resists are photosensitive, so that the masking patterns can be photographically produced on the surface to be protected. These latter resists are normally referred to as photoresists. The process of photographically defining a photoresist mask on a metal surface and then etching away the unprotected portions of the metal surface is generally referred to as photoengraving.

Photoresist maskants are used, for example, to engrave complex decorative patterns on a surface, to engrave plates for printing photographs, to define wiring and connection patterns on electronic circuit boards, and to etch oxide layers and metallization patterns for semiconductor devices such as transistors and integrated circuits. It is obviously highly desirable that the photoresist be adherent and highly resistant to attack by the etchant. This permits deep etches, high resolution patterns, etc. Generally, the more resistant the photoresist is to etchant attack, the more difficult it is to remove.

In making semiconductor devices, it is particularly important that the photoresist be especially resistant to attack and yet especially thoroughly removed after it is used. In semiconductor device manufacture, the photoresist is applied to the face of a semiconductive material wafer. The pattern is photographically delineated, and the wafer face selectively etched. The photoresist must then be meticulously removed to prepare the wafer face for subsequent processing steps. No residue or surface contamination should be left on the wafer face. A typical photoresist used in semiconductor device manufacture is KMER (Kodal Metal Etch Resist). This type of photoresist is an organic solvent strippable polymer and/or colloid of the type disclosed in U.S. Pat. Nos. 2,848,328 Hepher; 2,852,379 Hepher et al; 2,940,853 Sangura et al; and 3,458,313 Webb. Photoresists such as these have been removed in the past using a wide variety of strippers, including chlorinated solvents and oxygenated organic materials such as phenols and cresols. U.S. Pat. Nos. 3,335,087 Koers and 3,335,008 Mandell, Jr. disclose adding hydrofluoric acid to such strippers. Phenol-type and cresol-type materials comprise a substantial proportion of popular commercially available strippers. On the other hand, such strippers have special handling and waste disposal requirements I consider desirable to avoid. Such strippers can be avoided, for example, by using special stripping techniques, as for example by using elevated stripper temperatures and/or pressures.

I have found a stripping composition that does not require a mineral acid or an oxygenated organic solvent. Accordingly, it is less caustic and waste disposal is considerably easier. In addition, my composition is highly miscible with water and does not require any special temperatures or pressures for use. It can be used under atmospheric pressure at room temperature, which makes handling of the composition considerably easier. It is thorough in its cleansing action, leaving no recognizable residue or surface contamination, and is simple to use. Moreover, it is stable, low in initial cost and in disposal cost, and can even be reclaimed by distillation.

OBJECTS AND SUMMARY OF THE INVENTION

An object of this invention is to provide a new composition for stripping photoresist masks, particularly photoresist masks on a semiconductor wafer face.

The invention comprehends a stripper composition comprising, by volume, about 15–50% dodecylsulfonic acid, up to 3% formic acid, and the balance equal portions of tetrachloroethylene and ortho-dichlorobenzene.

DESCRIPTION OF THE PREFERRED EMBODIMENTS

This invention combines a high proportion of dodecylsulfonic acid with equal volume proportions of two chlorinated organic solvents previously known to be useful in photoresist stripping. The dodecylsulfonic acid provides a stronger and more thorough stripping action and makes the stripper miscible with water. The two organic solvents in my stripper are tetrachloroethylene and ortho-dichlorobenzene. Additions of up to 3%, by volume, formic acid appear to enhance the stripping action even further. However, the enhanced action produced by formic acid can be deleterious to any aluminum exposed to the stripper.

At least about 15%, by volume, dodecylsulfonic acid is necessary to obtain sufficiently rapid photoresist attack, thorough surface cleansing, and miscibility of the chlorinated organic solvents with water. In one sense, I also consider the dodecylsulfonic acids as softening the photoresist for easier removal by the chlorinated solvents. Best results have been obtained with more than about 30% by volume dodecylsulfonic acid. More than about 50% dodecylsulfonic acid appears undesirable in that it may attack aluminum metallization on a silicon slice face.

Substantially equal volumes of the tetrachloroethylene and ortho-dichlorobenzene should be used to obtain the benefits of this invention. In this proportion they are not only effective but stable. They appear to provide benefits not available from either one alone. In general, these should be used in stripper percentages less than about 10 stripper percentage points apart. For example, if the tetrachloroethylene proportion is about 25%, by volume, I would not want the ortho-dichlorobenzene proportion to exceed about 35%, by volume, and vice versa. The combined volumes of the tetrachloroethylene and the ortho-dichlorobenzene should jointly comprise about 50–85% by volume of the stripper, preferably about 50–70%. In equal volumes they would each comprise about 25–42% by volume of the stripper composition, preferably about 25–35% of the mixture.

In general, an equal volume mixture of the two chlorinated organic solvents and the dodecylsulfonic acid can be used, in which each of the three components comprises about one-third of the stripper by volume. Such a stripper would consist of about 30–35% by volume of each of dodecylsulfonic acid, tetrachloroethylene, and ortho-dichlorobenzene. I prefer the latter two components be present in substantially equal volumes.

In some instances, enhanced stripping speed may be desired. Small amounts of formic acid added to my stripper can be effective in enhancing stripping action. In some instances, about 1% formic acid is needed to sufficiently accelerate stripping action, while in other instances up to 3% may be desired. As hereinbefore indicated, the enhanced stripping action may be aggressive enough to deleteriously affect an aluminum metallization pattern exposed under the photoresist. Accordingly, I would not ordinarily include formic acid in the stripper if any aluminum is exposed to it under the photoresist, as for example an aluminum metallization pattern. Instead, I may choose to include it in the stripper used in earlier process steps, before the aluminum metallization layer is applied. A stripper with formic acid would thus preferably contain by volume about 1–3% formic acid, about 50–84% tetrachloroethylene and ortho-dichlorobenzene and at least 15% dodecylsulfonic acid.

The stripper of this invention is easily handled because it is used under ambient, i.e. room, conditions and because it is miscible with water. In addition, the chlorinated solvents involved are known and handling of them is a generally familiar matter. Further, the stripper rapidly attacks photoresists to produce a complete photoresist removal and a meticulously clean surface removal within minutes. There is no recognizable residue or surface contamination. It does not produce the waste disposal problem associated with photoresist strippers having oxygenated organic solvents such as phenols and cresols. An organic solvent strippable polymer and/or colloid photoresist mask such as KMER, if not completely washed away, is sufficiently softened to permit it to be rinsed away by a subsequent methanol spray. The surface need then only be dried. It is sufficiently clean with the next processing step, even when processing silicon wafers to make integrated circuits. By a methanol spray I mean, for example, a jet of methanol from a nozzle on a plastic squeeze bottle.

A methanol spray is not required, however. For instance, one may choose to instead use a series of successive warm or hot water rinses. Still further, it should be mentioned that my stripper can be used at an elevated temperature if desired, observing usual safeguards, of course. In fact it may be desirable to heat the stripper if the photoresist is particularly difficult to remove, such as an over-cured photoresist.

I should also mention that I have not found any chlorinated organic solvents equivalent to either tetrachloroethylene or ortho-dichlorobenzene for use in my stripper. Analogously, I have not found any substance that can be substituted for dodecylsulfonic acid in my stripper. In particular, sodium salts of dodecylsulfonic acid would be objectionable. Further, I am not aware of any other organic acid that can be substituted for formic acid.

The embodiments of the invention in which an exclusive property or privilege is claimed are defined as follows:

1. A low cost and readily disposable liquid composition for removing an organic solvent strippable polymer and/or colloid photoresist mask from a face on a silicon wafer substantially at room temperature and pressure, said composition including, by volume, about 15–50% dodecylsulfonic acid, and about 25–42% of each of tetrachloroethylene and ortho-dichlorobenzene in generally equal stripper proportions.

2. A stripper for removing an organic solvent strippable polymer and/or colloid photoresist mask from a semiconductor device surface, said stripper consisting essentially of, by volume, about 50–85% tetrachloroethylene and ortho-dichlorobenzene in generally equal amounts, up to 3% formic acid, and the remainder substantially dodecylsulfonic acid.

3. A low cost, phenol-less stripper for a hardened, organic solvent strippable polymer and/or colloid photoresist on a silicon wafer surface, said stripper consisting essentially of, by volume, at least about 30% dodecylsulfonic acid, up to 3% formic acid, about 25–35% tetrachloroethylene, and about 25–35% ortho-dichlorobenzene, wherein the stripper percentage of tetrachloroethylene and of ortho-dichlorobenzene are less than about 10 stripper percentage points apart.

4. A low cost, phenol-less stripper for a hardened, organic solvent strippable polymer and/or colloid photoresist material on a silicon wafer face having no unprotected aluminum layer thereon, said stripper consisting essentially of, by volume, about 50–84% tetrachloroethylene and ortho-dichlorobenzene in generally equal amounts, about 1–3% formic acid, and at least 15% dodecylsulfonic acid.

5. A low cost and readily disposable liquid composition suitable for removing a hardened, organic solvent strippable polymer and/or colloid photoresist material from a face on a silicon wafer substantially at room temperature and pressure, which wafer face has an exposed aluminum layer thereon, said composition consisting of about 30–35%, by volume, of each of dodecylsulfonic acid, tetrachloroethylene, and ortho-dichlorobenzene, with the latter two being present in substantially equal volumes.

* * * * *